United States Patent [19]

De La Rosa

[11] Patent Number: 5,519,383

[45] Date of Patent: May 21, 1996

[54] BATTERY AND STARTER CIRCUIT MONITORING SYSTEM

[76] Inventor: Pablito A. De La Rosa, 1406 Green Bay St., San Diego, Calif. 92154

[21] Appl. No.: 258,509

[22] Filed: Jun. 10, 1994

[51] Int. Cl.⁶ .................................................. G08B 21/00
[52] U.S. Cl. .......................... 340/636; 340/455; 324/435; 320/48
[58] Field of Search .................................. 340/636, 455, 340/663; 324/435; 320/48

[56] References Cited

U.S. PATENT DOCUMENTS

| | | | |
|---|---|---|---|
| 3,673,588 | 6/1972 | Riff | 340/455 |
| 4,247,813 | 1/1981 | Gansert et al. | 340/455 |
| 4,665,370 | 5/1987 | Holland | 340/636 |
| 4,929,931 | 5/1990 | McCuen | 340/455 |
| 5,345,163 | 9/1994 | Gibbons et al. | 340/636 |

Primary Examiner—Brent A. Swarthout
Assistant Examiner—Edward Lefkowitz
Attorney, Agent, or Firm—Brown, Martin, Haller & McClain

[57] ABSTRACT

A battery monitoring system has an input for connection to a battery to be tested, and an indicator for providing a visual indication of when the battery power falls below a selected minimum value. A switching device controls connection of the battery to the indicator, and is controlled to switch from its off state to its on state in the event that the battery voltage falls below the selected minimum value. The system may comprise a separate, portable unit to be connected to a battery to be tested, or may be built into an electrical system powered by a battery to continuously monitor battery status.

13 Claims, 2 Drawing Sheets

BATTERY AND STARTER CIRCUIT MONITORING SYSTEM

BACKGROUND OF THE INVENTION

The present invention relates generally to battery and starter circuitry testing devices, and is particularly concerned with a device or apparatus for early warning of imminent battery failure or poor starter circuit conditions in automobiles or other vehicles, or other devices employing battery power.

Vehicles employ a battery both for starting the engine and running the other electrical systems in the vehicle. It is inconvenient when the battery fails unexpectedly, causing the vehicle and thus the motorist to be stranded wherever the battery fails. Up to now, there has been no effective device for monitoring the battery condition to provide a warning when battery failure is imminent, even though motorists would much rather have the opportunity to change the vehicle battery before the vehicle actually breaks down. Currently, battery performance load tests can be performed at a service station, but this is expensive and requires the driver to take the vehicle in for a service. Furthermore, it is very time consuming because a battery must first be fully charged before it can be load tested. The load test procedure adapted by the military is based on a 20 hour test period. For example, a 200 ampere battery must be able to provide 10 ampere continuously for 20 hours before reaching its low voltage limit. This is very impractical for the motoring public, and is also expensive. This test is of limited value, since even if the test indicates that the battery is performing as required, the battery might still fail at some time in the relatively near future. Since the driver cannot take their vehicle in every day, or even on a weekly basis, to have the battery tested, current battery performance testing is impractical and does not significantly reduce the risk of unexpected battery failure. Basically, the only battery performance testing done now is when the driver turns on the ignition key. The battery is either able to start the car or it does not and this is where the problem lies. Thus, there is no effective test for advance indication of imminent battery failure.

Similar drawbacks are inherent in other equipment using battery power. Batteries may fail at inconvenient times, and there has, up to now, been no convenient way to monitor battery performance either continuously or on a relatively regular basis.

SUMMARY OF THE INVENTION

It is an object of the present invention to provide a new and improved device or apparatus for monitoring the performance of a battery and providing an early warning of imminent battery failure prior to the actual failure of the battery, so that the battery can be replaced before the equipment actually breaks down.

According to the present invention, a battery failure early warning device is provided, which comprises an indicator for providing a visual indication when the available reserved battery power capacity falls below a predetermined value, and a control circuit for controlling actuation of the visual indicator, which may be a warning light or the like. The control circuit has an input for connection to a battery to be tested, and a switch for controlling connection of the input to the indicator. A detector responsive to the battery reserved power capacity is also connected to the input and to the switch, and operates to change the switch from an off or non-conductive state into an on or conductive state when the detected battery reserved power capacity falls below the predetermined value.

The testing device may be provided in a separate housing or unit with input leads or terminals for connecting to the battery positive and negative connectors, or positive and ground. Alternatively, the testing device circuitry may be built into an existing battery operated electrical circuit, for example a vehicle electrical system, with the warning light being provided on the vehicle dashboard alongside the other indicators.

Preferably, the testing unit or circuit also includes a second visual indicator for indicating a proper battery charging voltage, and an electronic switch for controlling connection of the input to the second indicator when the voltage is below a second predetermined voltage necessary for operation of a device to be run by the battery, such as a vehicle starter motor.

A third indicator may also be provided for indicating when the battery charging voltage is above a third voltage higher than the second predetermined voltage. The third voltage is the upper limit for safe battery charging. A switch controls actuation of the third indicator and is responsive to voltages above the third voltage to switch on the indicator. This can provide a warning that a battery charging unit, such as a vehicle alternator, is malfunctioning, prior to battery failure as a result of overcharging.

A normal charging voltage indicator and a high charging voltage indicator allow the accuracy and conclusiveness of the battery failure early warning indicator to be validated. Unlike the present alternator indicator lights that are currently used in todays automobiles, which only indicate the presence of a charging voltage and not whether it is adequate or not, the charging indicator indicates a sufficient charging current that is capable of maintaining the battery in its full charge condition. This collaborates the validity of the impending battery failure warning of the system. To explain this feature briefly, assume that a motorist has been driving for about one hour on a freeway with the early warning system installed and with all indications normal. Then, assume the driver stops for gas. Once the gas tank is filled, assume the driver attempts to re-start the car, and notices that although the engine starts, the battery failure early warning indicator stays lit while the engine is cranked. This can only mean one sure thing; that the battery has no longer the capacity to hold the minimum reserve power required. This is further validated by the fact that the driver has been driving on the freeway for an hour with normal charging current sufficient to maintain a fully charged battery had the battery been in a condition to hold a charge. This assures the driver that the battery is going bad and will soon have to be replaced, with no further testing required. This is the system's validation. It provides conclusive evidence of where the problem lies without needing further troubleshooting.

The indicator lights may be provided on a separate test unit for connection to any battery to be tested, or the testing device circuitry may be built into electrical circuitry controlling a device, such as a vehicle starter motor, which is operated by the battery. In that case, the indicator lights may be provided on the vehicle dashboard, for example, and provide indication of the battery's reserved capacity whenever the vehicle ignition is switched on to crank the engine.

The system may also be provided with a further indicator for detecting an excessive voltage drop or internal resistance in the starting circuit. If this indicator light comes on while cranking the engine, whether the engine starts or not, it provides a sure indication of a loose or bad connection between the starter and the battery terminals. Again, it pin points the problem.

But without the system of this invention, the battery would be the prime suspect in this scenario; and by replacing the battery, the loose connection that was causing the problem may very well be inadvertently corrected by the mere action of putting in another battery and tightening the connection. But, was it really necessary to have replaced the battery when all that was required was the tightening of the connections? This invention reduces or eliminates guess work and unnecessary expense. It will disclose to the driver with certainty where the problem lies. Preferably, the various indicators are provided by different color LEDs, for example green for normal operation, red for battery reserved power, no green for low charging current, yellow for high charging voltage, and orange for excessive voltage drop. With this invention, all the driver needs is to interpret the following indications:

(a) Green indicator when the car engine is running means normal operation.

(b) No indicator lit when the car engine is running indicates inadequately low or the lack of charging current.

(c) Yellow indicator means a high charging voltage, which is detrimental to the battery and other electrical circuits.

(d) Red indicator only while cranking means an excessive voltage drop (IR) in the starting circuit. In this case, all that is required is to check battery cables, and clean and tighten the battery terminals and connectors.

This invention makes all these checks at a flip of the ignition key without the aid of a trained mechanic and complicated test equipment. It reduces or eliminates all guess work and saves time and unnecessary repair expenses.

Above all, it reduces or eliminates car breakdowns caused by unexpected battery failures, faulty starters, bad wiring, loose connections, or dirty and corroded battery terminals.

The test device of this invention allows a battery to be tested as desired by the user so that an advance indication is provided of poor battery conditions, prior to actual battery failure. The inconvenience of being stranded when a vehicle battery fails, for example, can thus be avoided, and the battery can be changed prior to actual failure and breakdown of a vehicle or other piece of equipment being powered by the battery. It also provides a warning if the starter is not getting enough power due to bad wiring, loose connection or corroded or dirty battery terminals.

BRIEF DESCRIPTION OF THE DRAWINGS

The present invention will be better understood by the following detailed description of some preferred embodiments of the invention, taken in conjunction with the accompanying drawings, in which like reference numerals refer to like parts, and in which.

DESCRIPTION OF THE PREFERRED EMBODIMENTS

Figure 1:
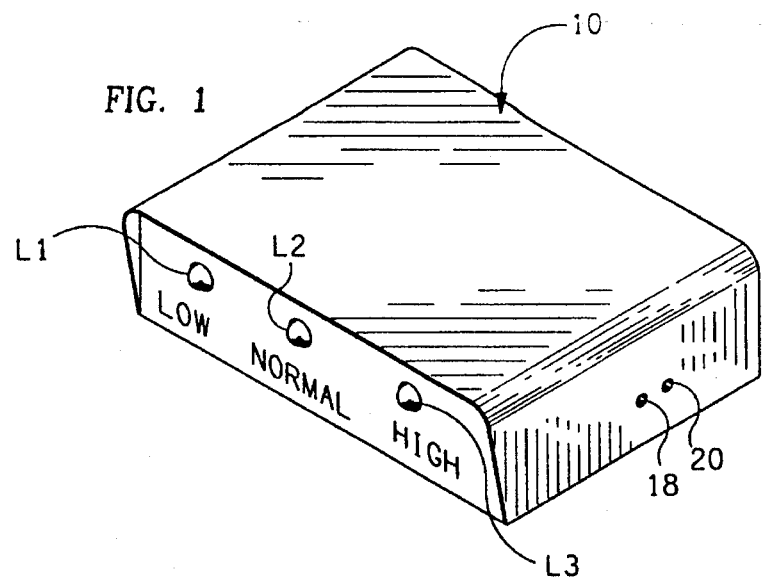
FIG. 1 is a perspective view of a battery testing unit according to a first embodiment of the invention.
Figure 2:
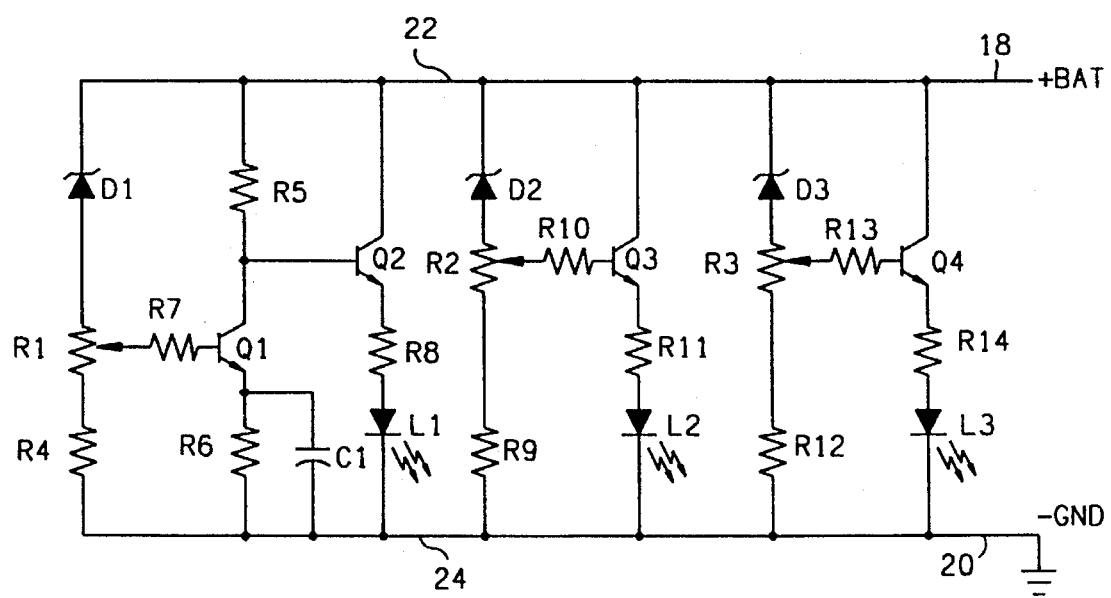
FIG. 2 is a schematic of the testing circuit.

FIG. 1 illustrates a portable battery testing unit 10 according to a first embodiment of the invention, while FIG. 2 is a schematic of the testing circuitry in unit 10. Although the circuitry is enclosed in a portable unit for connecting to any battery to be monitored in the illustrated embodiment, it may alternatively be built into the circuitry of a battery operated device, such as a vehicle dashboard instrumentation, in order to continuously monitor the battery condition whenever the device is operated.

As illustrated in FIG. 1, unit 10 has three indicator lights L-1,L-2 and L-3 on its front face, which are of different colors, such as red, green and yellow, as well as connector leads or terminals 18,20 for connecting the unit to a battery. The indicator lights are operated by control circuitry depending on the battery charging voltage or reserved power capacity, as illustrated in FIG. 2. It will be understood that, where the device is to be used for vehicle battery testing, indicator lights L-1,L-2 and L-3 may alternatively be built into the vehicle dashboard and the leads 18,20 may be permanently connected to the battery.

As illustrated in FIG. 2, the circuit has a positive terminal 18 which is connected to the battery positive connector, and a negative or ground terminal 20 which may be connected to the battery negative or ground. A first Zener diode D-1 is connected in series with variable resistance or potentiometer R-1 and resistance R-4 across positive lead 22 and negative or ground lead 24. A first transistor Q-1 has its collector connected via resistance R-5 to positive lead 22 and its emitter connected via resistor R-6 and capacitor C-1 connected in parallel to the negative or ground lead 24. The base of transistor Q-1 is connected via resistor R-7 to the potentiometer R-1. The collector of transistor Q-1 is also connected to the base of a second transistor Q-2, which has its collector connected to the positive lead 22 and its emitter connected to the first indicator light L-1 via resistor R-8. The foregoing circuit components comprise the control circuitry for controlling actuation of light L-1, as will be explained in more detail below.

A second Zener diode D-2 is connected to the positive lead 22 and via potentiometer R-2 and resistor R-9 to the negative or ground lead 24, and is also connected via resistor R-10 to the base of transistor Q-3. Transistor Q-3 acts as a switch for controlling actuation of the second indicator light L-2, and has its collector connected to the positive lead 22 and its emitter connected via resistor R-11 to the light L-2.

Similarly, third Zener diode D-3 is connected between the positive lead 22 and ground lead 24 via potentiometer R-3 and resistor R-12, and is connected to the base of transistor Q-4 via resistor R-13. Transistor Q-4 acts as a switch for controlling actuation of the third indicator light L-3, to which it is connected via resistor R-14. The collector of transistor Q-4 is connected to the positive lead 22. The Zener diodes D-1,D-2 and D-3 together with variable resistors R-1,R-2 and R-3 can be controlled to set the voltage at which each of the indicator lights L-1,L-2 and L-3 will light up, as discussed in more detail below. Typically, these will be arranged such that light L-2 lights up when the battery voltage is within the desired operating range, L-1 lights up when the voltage falls below a predetermined minimum value and L-3 lights up when the voltage is above a predetermined safe maximum value. In the case of a vehicle starter motor battery, the normal charging voltage is 13 volts or higher, while a voltage of 10 volts is the minimum and a voltage of 15 volts or higher indicates overcharging of the battery. Thus, L-1 is arranged to light up if the voltage is less than or equal to 10 volts, L-2 lights up when the voltage is greater than or equal to 13 volts, and L-3 lights up if the voltage is greater than or equal to 15 volts. Lights or LEDs L-1,L-2 and L-3 are of different colors to provide for easier differentiation. L-1 may be a red LED, L-2 a green LED, and L-3 a yellow LED, for example.

Zener diode D-2 will conduct at voltages of 13 volts or higher across terminals 18 and 20, and will actuate switching transistor Q-3 to fire or conduct so that the battery voltage is applied across light L-2, causing this light to light up. The green light L-2 thus indicates that a proper charging voltage is present when the engine is running.

Similarly, Zener diode D-3 will conduct at voltages of 15 volts or higher, actuating switching transistor Q-4 to turn on warning light L-3, indicating that the battery is overcharging, possibly due to a defect in the alternator or its associated battery charger circuitry. Thus, if the charging voltage is higher than normal, both the green light L-2 and the yellow light L-3 will light up.

The red warning light L-1 is arranged to go on if the charging voltage drops below 10 volts. The Zener diode D-1 will conduct at voltages of 10 volts or higher, so that as long as the voltage is at or above 10 volts, transistor Q-1 will conduct, and switching transistor Q-2 will be off. If the voltage at terminal 18 drops below 10 volts, diode D-1 no longer conducts, and the transistor Q-1 will cut off. This allows transistor Q-2 to fire, and red light L-1 will light up, indicating that the battery's reserved power is now insufficient to maintain the desired starting voltage at the desired minimum required limit.

The battery testing circuit of FIG. 2 can be provided in a small, portable testing unit as illustrated in FIG. 1 for connection to a battery to be tested, but is preferably built into an electrical system to be operated by a battery, such as a vehicle electrical system, with the indicator lights L-1,L-2 and L-3 mounted on the vehicle dashboard or indicator panel in a similar manner, so that the user is aware of the battery condition every time the car is started. The driver can then take their car or other vehicle into a service station for a battery change or other check of the electrical system before the battery actually fails, avoiding the inconvenience of having the vehicle break down. A similar circuit may be built into any electrical system operated by a battery, with appropriate setting of the components based on the minimum and maximum battery operating voltage.

In one example of a circuit for testing a vehicle battery, Zener diodes D-1,D-2 and D-3 had a breakdown voltage of 10 Volts, 11 Volts and 14 Volts, respectively, R-1 and R-4 had a total resistance of 5.1 KOhms, R-7, R-10 and R-13 were each 430 ohms, R-5 was 5.1 KOhms, R-8, R-11 and R-14 were each 680 ohms, R-2 and R-9 had a total resistance of 5.1 KOhms, and R-3 and R-12 also had a total resistance of 5.1 KOhms.

Figure 3:
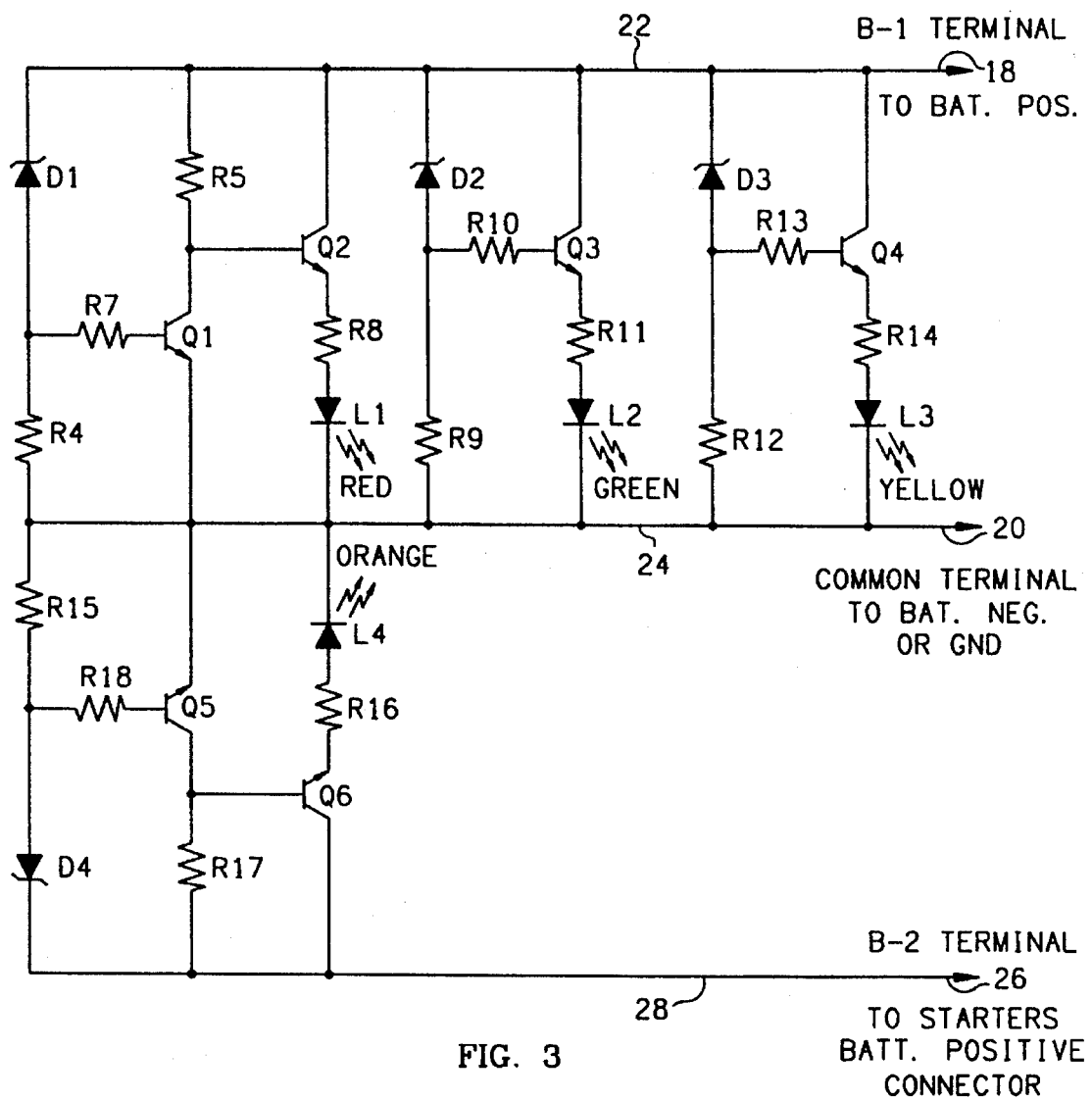
FIG. 3 is a schematic illustration of a modified testing circuit according to a second embodiment of the invention.

FIG. 3 illustrates a testing circuit according to another embodiment of the invention, which is preferably built into a battery operated electrical system such as a vehicle engine starter system, but may alternatively be provided in a separate unit for connection to the system. This circuit is similar to that of FIG. 2, and like reference numerals have been used for like components as appropriate, but additionally includes circuitry for testing resistance in the starter circuits. Thus, the lower part of the circuit in FIG. 3 is designed to detect the voltage reaching the starter motor via the starting circuits, cables and connectors. In the event of a bad connection, deteriorated cables, corrosion of the battery terminals or the like, internal resistance of the circuit will rise such that there will be an excessive voltage drop in the circuit, and the voltage reaching the starter motor may be less than the minimum required for proper operation.

In the circuit of FIG. 3, red light L-1 will light up as in FIG. 2 if the voltage at terminal 18 falls below 10 volts, green light L-2 will light up under normal operating voltages, and yellow light L-3 will light up when excessive charging voltages are detected, indicating a possible alternator malfunction. The circuit has a third input terminal 26 which is connected to the battery plus terminal of the starter motor. Terminal 26 is connected via lead 28 to one side of Zener diode D-4. The other terminal of diode D-4 is connected via resistor R-15 to ground or negative lead 24. Diode D-4 is also connected to the base of transistor Q-5 via resistor R-18 to control switching on and off of that transistor. Transistor Q-5 in turn has its collector connected to the base of switching transistor Q-6 which controls operation of a fourth indicator light L-4 which is connected between terminals 26 and 20 via transistor Q-6 and resistor R-16. The emitter of transistor Q-5 is connected to the earth or negative lead 24, while the collector is connected via resistor R-17 to the starter motor positive input 26, as well as to the base of transistor Q-6. The fourth indicator light or LED L-4 will be of a different color than the others, for example orange.

Zener diode D-4 has a breakdown voltage set at 9.5 volts, and will cease to conduct if the input voltage to the starter motor falls below this voltage. When D-4 ceases to conduct, transistor Q-5 will also cease to conduct and the voltage at lead 28 will then be applied to the base of transistor Q-6. Q-6 will therefore start to conduct, and light L-4 will light up, indicating that the voltage reaching the starter is less than the minimum required for normal operation.

The remainder of the circuit operates exactly as described above in connection with the first embodiment. Where the circuit is built into the starter circuitry of a vehicle, all of the indicator lights or LEDs may conveniently be built into the instrument panel or dashboard of the vehicle, adjacent the other indicator lights such as the oil warning light, low fuel warning light and the like.

Test observations must be made when the ignition key is turned into the start position, the starter is engaged and the motor is cranking. As long as the battery has sufficient reserved power and the starter wiring is satisfactory, it should be able to supply enough current to the starter and still maintain a voltage of 10 volts or above. As long as there is a voltage of 10 volts or higher at terminal 18, D-1 and Q-1 conduct and Q-2 will be in cutoff and the red light or LED L-1 will stay off. If the voltage at 18 is at least 13 volts, D-2 and Q-3 will conduct and the green LED will light up to indicate a normal charging voltage. If the green LED does not light up, either a low or zero charging voltage is indicated. If the alternator output goes above the set limit of 14 volts, D-3 and Q-4 will also conduct, and the yellow LED L-3 will light up, indicating a higher than normal charging voltage and a possible problem with the alternator.

Excessive voltage drop in the starter circuit such that the voltage at terminal 26 drops below 9.5 volts will cause D-4 and Q-5 to cease to conduct, and Q-6 to start to conduct so that orange LED L-4 will light up. This indicates that the voltage reaching the starter is less than the minimum required for proper operation, probably as a result of a circuit connection problem such as corroded battery terminals, bad connections, deteriorated cables or the like.

Thus, there are a number of possible states for lights L-1,L-2,L-3 and L-4 which provide an indication of the status of the battery and starter circuit. The operator or driver of a vehicle can thus monitor the condition and performance of the battery, alternator and starter circuits every time they switch on the ignition. The indicator lights pinpoint the component which is at fault without having to hire a mechanic to find the problem. The problem can thus often be solved before the vehicle actually fails to start or breaks down at an inconvenient time or location.

When the ignition is turned on with the engine running, if green light L-2 alone lights up, the operator knows that the battery charging system is operating properly and that there is no problem in the alternator or starting circuitry. If green light L-2 does not light up while cranking, inadequate or zero charging current is indicated. If red light L-1 lights up while cranking the engine, the operator immediately knows that the reserved power in the battery is low, and that the battery should be checked or replaced before it fails. If both green light L-2 and yellow light L-3 light up, the operator knows that the charging voltage is higher than normal and that the alternator may be malfunctioning. Finally, if orange LED L-4 lights up while cranking, the voltage reaching the starter motor is less than the minimum required for proper operation, indicating that there is a bad connection, cable or corroded terminal in the starter circuitry. The operator thus immediately knows that there is a problem, before the vehicle actually fails to start, and also knows where to look in the electrical system for the source of the problem.

In one example of the circuit of FIG. 3, D-1 had a breakdown voltage of 10 volts, D-2 was set at 13 volts, D-3 was 14 volts, and D-4 was 9.5 volts. Resistors R-4,R-5,R-9,R-12,R-15 and R-17 were all 5.1 KOhms, resistors R-7, R-10,R-13 and R-18 were 430 ohm resistors, and resistors R-8,R-11, R-14 and R16 were all 680 ohm resistors. The components may be set at different values for monitoring different battery operated devices.

The battery failure early warning system is designed primarily for automobiles, but is also applicable to equipment and apparatus where the presence of, or the lack of adequate power is to be monitored. On equipment where a storage battery is the source of power such as the starter motor of a car, this system can detect and give warning when the battery's reserved power capacity reaches the minimum set level so that the battery can be replaced before it can fail unexpectedly.

The system includes several independent electronically controlled visual indicating devices, and continuously monitors the performance of a battery's charging system to indicate a normal operating condition, a high charging condition, or the lack of an adequate charging voltage. Importantly, it monitors the battery's available reserved power capacity under maximum loading condition during cranking to warn the operator when the set minimum level is reached. It also monitors the starter's circuitry and gives a visual warning when there is any excessive voltage drop due to a bad wiring, loose connection, or a corroded and dirty battery terminal. It also detects an open circuit in the starter motor.

The minimum and maximum input voltage limits that are set according to each particular application triggers the system's solid state switching device to its on or off state to give the appropriate indicator signal for each status monitored. The system is connected to the appropriate circuit; the battery, the starter, or any appropriate circuit to be monitored, as a portable unit, or as an integral part of an equipment's instrumentation system powered by the battery to be monitored.

Although the warning indicators work independently when monitoring the circuit, they all function complimentarily as a unit in supporting the validity and accuracy of each warning signal indicated.

Furthermore, with an ignition temporary disconnect switch, this system will allow any operator with or without any mechanical expertise to conduct the full 10-seconds starting circuit test which is normally performed only by certified mechanics using sophisticated test equipment. This test is to evaluate the overall performance of the car's starting system and will detect batteries with marginal capacity.

The detector device or circuit of this invention thus provides an early warning of improper operating conditions of the battery or other parts of the starter circuitry, prior to an actual failure to operate. This avoids the need for expensive testing by mechanics, and also allows the circuit operation to be monitored continuously, each time the battery operated device is switched on. The device is compact and can be built into an electrical system or may be left hooked up the electrical system where it is provided as a separate test unit. It may be provided as standard equipment on all vehicles, for example, and on other machines or devices using batteries, avoiding the inconvenience of an unexpected battery failure.

Although some preferred embodiments of the invention have been described above by way of example only, it will be understood by those skilled in the field that modifications may be made to the disclosed embodiments without departing from the scope of the invention, which is defined by the appended claims.

I claim:

1. A battery and starter circuit monitoring system, comprising:

a test circuit having a first input terminal for connection to a battery to be tested;

the circuit having an indicator for providing a visual indication when an available reserved power capacity of the battery is below a first minimum value under full load conditions;

a first switching device for controlling connection of the indicator to the input terminal, the switching device having a non-conductive state in which the indicator is off and a conductive state in which the indicator is on;

control means for controlling switching of the switching device between the non-conductive and conductive state, the control means including a detector for detecting a first voltage at the input terminal and having an output dependent on said first voltage and switching means responsive to the detector output for switching the switching device from its non-conductive to its conductive state if the detected battery reserved power capacity falls below said selected minimum value;

said circuit having a second input terminal for connection to an input terminal of a component connected to said battery to detect a second voltage reaching the component, a second indicator for providing a visual indication when the second voltage reaching the component falls below a second minimum value, a second switching device for controlling connection of said second indicator to said second input terminal, and additional control means for controlling switching on and off of said second switching device, said additional control means comprising means for detecting if the second voltage at said second input terminal falls below said second minimum value and switching on said second switching device to actuate said second indicator if a voltage below said second minimum value is detected.

2. The system as claimed in claim 1, wherein the indicator comprises a light.

3. The system as claimed in claim 1, wherein the circuit includes a third indicator for providing a visual indication of when the battery is above said first minimum value, and a third switching device for controlling connection of the third indicator to the input terminal, the third switching device comprising means for switching between a non-conductive state and a conductive state when the battery is above said first minimum value.

4. The system as claimed in claim 3, wherein said indicators comprise light emitting diodes of different colors.

5. The system as claimed in claim 3, wherein the circuit comprises means for testing whether a connected battery is operating within a desired operating voltage range between said first minimum value and a predetermined maximum value, includes a fourth indicator for providing a visual indication when the battery charging voltage is above said predetermined maximum value and a fourth switching device for controlling connection of the fourth indicator to the input terminal, the fourth switching device comprising means for switching between a non-conductive state and a conductive state when said battery voltage is above said maximum value.

6. The system as claimed in claim 5, wherein said indicators comprise four light emitting diodes of different colors.

7. The system as claimed in claim 6, wherein the circuit is enclosed in an outer housing, the housing having a front face and the light emitting diodes being mounted on the front face of the housing.

8. The system as claimed in claim 1, wherein said indicators comprise light emitting diodes of different colors.

9. The system as claimed in claim 1, wherein said detecting means comprises a Zener diode having a breakdown voltage of said selected minimum value, whereby said Zener diode ceases to conduct if said battery voltage falls below said minimum value, said switching means comprising a further switching device having a control input connected to said Zener diode and being on when said Zener diode is conducting and off when said Zener diode ceases to conduct, said further switching device having a control output connected to said first switching device and comprising means for switching said first switching device on when said further switching device is off.

10. The system as claimed in claim 9, wherein said switching devices comprise transistors.

11. A vehicle electrical system comprising:

a battery having a voltage dependent on a reserved battery power capacity;

a starter motor having an input;

starter circuitry connecting said battery to said starter motor input;

a battery monitoring circuit having a first input connected to said battery and a second input connected to said starter motor to detect input voltage at said starter motor;

a first indicator light linked to said monitoring circuit and mounted on a vehicle indicator panel;

the battery monitoring circuit including switching means for switching said first indicator light on when said battery reserved power capacity is below a predetermined minimum value;

a second, normal operation light for indicating when said battery is at a normal power level;

said circuit including switching means for switching said second light on when said battery voltage is above a selected value;

a third indicator light connected to said monitoring circuit for providing an indication if said starter motor input voltage falls below a second predetermined minimum value, and switching means for switching said third indicator light on if said starter motor input voltage is below said second predetermined minimum value.

12. The system as claimed in claim 11, including a fourth indicator light for indicating when the battery charging voltage is above a selected maximum value, said circuit including switching means for switching said fourth light on when said charging voltage is above said selected maximum value.

13. The system as claimed in claim 11, wherein said switching means comprises a Zener diode connected to said battery and having a breakdown voltage of said first predetermined minimum value, the Zener diode having an output, a first switching device connected to the output of said Zener diode and having an output connected to a second switching device, each of said switching devices having an on, conductive state and an off, non-conductive state, the first switching device being responsive to the output of said Zener diode and being off when said Zener diode is non-conductive and on when said Zener diode is conductive, and the second switching device being responsive to the output of said first switching device and being on when said first switching device is off to switch said indicator light on.

* * * * *

UNITED STATES PATENT AND TRADEMARK OFFICE
CERTIFICATE OF CORRECTION

PATENT NO. : 5,519,383
DATED : May 21, 1996
INVENTOR(S) : Pablito De La Rosa

It is certified that error appears in the above-indentified patent and that said Letters Patent is hereby corrected as shown below:

COLUMN 8, CLAIM 2, LINE 64, CHANGE "THE", SECOND OCCURRENCE, FOR --EACH--.

Signed and Sealed this

Third Day of September, 1996

Attest:

BRUCE LEHMAN

*Attesting Officer*     *Commissioner of Patents and Trademarks*